United States Patent [19]

Meltzer

[11] Patent Number: 4,466,099
[45] Date of Patent: Aug. 14, 1984

[54] INFORMATION SYSTEM USING ERROR SYNDROME FOR SPECIAL CONTROL

[75] Inventor: David Meltzer, Wappingers Falls, N.Y.

[73] Assignee: International Business Machines Corp., Armonk, N.Y.

[21] Appl. No.: 349,483

[22] PCT Filed: Dec. 30, 1981

[86] PCT No.: PCT/US81/01766
§ 371 Date: Dec. 30, 1981
§ 102(e) Date: Dec. 30, 1981

[51] Int. Cl.³ ............................................. G06F 11/10
[52] U.S. Cl. ........................................ 371/47; 371/37; 375/116; 375/110; 375/114
[58] Field of Search ...................... 371/26, 37, 38, 42, 371/47, 67; 375/114, 116

[56] References Cited

U.S. PATENT DOCUMENTS

| | | | |
|---|---|---|---|
| 3,733,585 | 5/1973 | Merlo | 371/47 |
| 3,836,957 | 9/1974 | Duke et al. | 371/38 |
| 3,860,907 | 1/1975 | Marshall | 371/47 |
| 3,913,068 | 10/1975 | Patel | 371/38 |

OTHER PUBLICATIONS

Chen, C. L. et al. "Error Migration Protection for Multiprocessor with Hierarchical Memory", *IBM Technical Disclosure Bulletin*, vol. 20, No. 9, Feb. 1978, 3579-3580.
Annunizata, E. J. et al. "Cache Error Handling in a Store-in-Cache Design", *IBM Technical Disclosure Bulletin*, vol. 20, No. 9, Feb. 1978, 3585-3586.
Galpin, R. J., *Digital Synchronizer*, Jun. 1972, IBM Technical Disclosure Bulletin, vol. 15, No. 1, pp. 81-83.

*Primary Examiner*—Jerry Smith
*Assistant Examiner*—Clark A. Jablon
*Attorney, Agent, or Firm*—James E. Murray

[57] ABSTRACT

Special control within a data processing system is signalled by a predetermined unique combination of data and error correcting code (ECC) bits. The predetermined combination, received from a source 1, is one which normally is decoded to indicate the presence of an uncorrectable error. A comparator 3 compares data bits held in a register 5 with a reference pattern of data bits held in a storage medium 7. At the same time, a syndrome generator 9 generates a syndrome from the received word, which syndrome is decoded by a syndrome decoder 11. If a particular flag syndrome sf (which is selected from the syndromes normally indicating the existence of an uncorrectable error) is detected, and comparator 3 indicates an equal comparison, AND 13 will provide a signal indicating that the unique combination has been received. It will also, through inverter 15 and AND 17 block transmission of an error indication to the system.

10 Claims, 3 Drawing Figures

INFORMATION SYSTEM USING ERROR SYNDROME FOR SPECIAL CONTROL

BACKGROUND OF THE INVENTION

1. Field of the Invention

This invention relates to information processing systems which utilize error correcting codes and which can benefit from the use of certain control signals. More particularly, the invention relates to incorporating special flag and/or status indicating code signals at random positions in serially ordered data without utilizing bit combinations which might otherwise normally be used to represent valid data.

2. Prior Art

There can be many situations in which it becomes desirable to include "flags" in fields of data that are utilized by an information processing system. These fields may be contained in a storage medium associated with the information processing system, or may be transmitted to the system via some communication link. For example, such flags could be used to provide synchronization of various kinds, to define the limits of variable length data messages, and to indicate the limits of storage fields assigned to various users in a multiprogramming system.

The typical straightforward approach to filling such a need is to allocate a particular combination of data bits to represent the desired flag. The disadvantage of this approach is that the number of bit combinations which can represent valid data are reduced if some of those combinations must be utilized to represent control flags.

Another approach to the problem is exemplified by U.S. Pat. No. 3,913,068 which describes a system in which data employed for synchronization purposes is arranged in a different code than data which represents information. With the instant invention, special symbols (flags) are coded in the same form as other data thereby conserving code utilization and bandwidth, as well as simplifying the system.

Other prior art of particular interest includes U.S. Pat. No. 3,836,957 and two articles appearing in the IBM Technical Disclosure Bulletin, Vol. 20, No. 9, Feb. 1978, pages 3579-3580 and 3585-3586. These items of prior art are of interest because they deal with responses by a system to syndromes which indicate the presence of a data error. However, they do not suggest utilizing error syndromes for purposes other than error handling. One manner in which the instant invention distinguishes significantly over such prior art is in utilization of predetermined data configurations and error syndromes for special system control.

BRIEF DESCRIPTION OF THE INVENTION

In accordance with a preferred embodiment of the invention, special characters are represented by predetermined combinations of data bits and error correcting code (ECC) redundancy bits. These predetermined combinations are selected from among the combinations which normally occur only when an uncorrectable error has occurred in a word. These predetermined patterns are decoded by the system as the special characters or flags. In the preferred embodiment, when a flag is recognized, no error indication will be transmitted to the using system.

The primary commercial advantages achieved with this invention are:

it does not impact the amount of information that can be represented within the information system (because the combinations utilized for the flags would otherwise have no valid meaning);

the invention does not degrade the normal error detection and correction capability of the system; and it is simple and inexpensive to implement.

DETAILED DESCRIPTION

The following descriptions of embodiments of the invention show how it can be incorporated into a typical information handling system. Aspects of such systems such as, for example, single error correction and specific detailed timing considerations, upon which this invention has little or no impact are not described in detail below. Those aspects will vary from system to system and are quite well known to those of ordinary skill in the art. Rather, the following discussion will concentrate on portions of the system that are affected by this invention.

In accordance with this invention, groups of bits representing data and associated ECC (error correction code) functions—each group representing a number element in a double error detecting single error correcting code system—are monitored for the presence of a predetermined syndrome, one normally associated with uncorrectable error (UE) conditions, and for the coincident presence in the data portion of each group of a predetermined data pattern, one normally (in the absence of a UE condition) representing ordinary data. When the predetermined syndrome is detected in conjunction with the predetermined data pattern, a flagging or delimiting condition is recognized, an associated indication is presented to control circuits of the system responsible for processing the data, and the UE condition normally associated with the predetermined syndrome is suppressed. If the predetermined error syndrome is detected but the predetermined data pattern is not found, the associated UE condition is not suppressed, and an error indication is passed on to control circuits of the system responsible for attending to error conditions.

Figure 1:
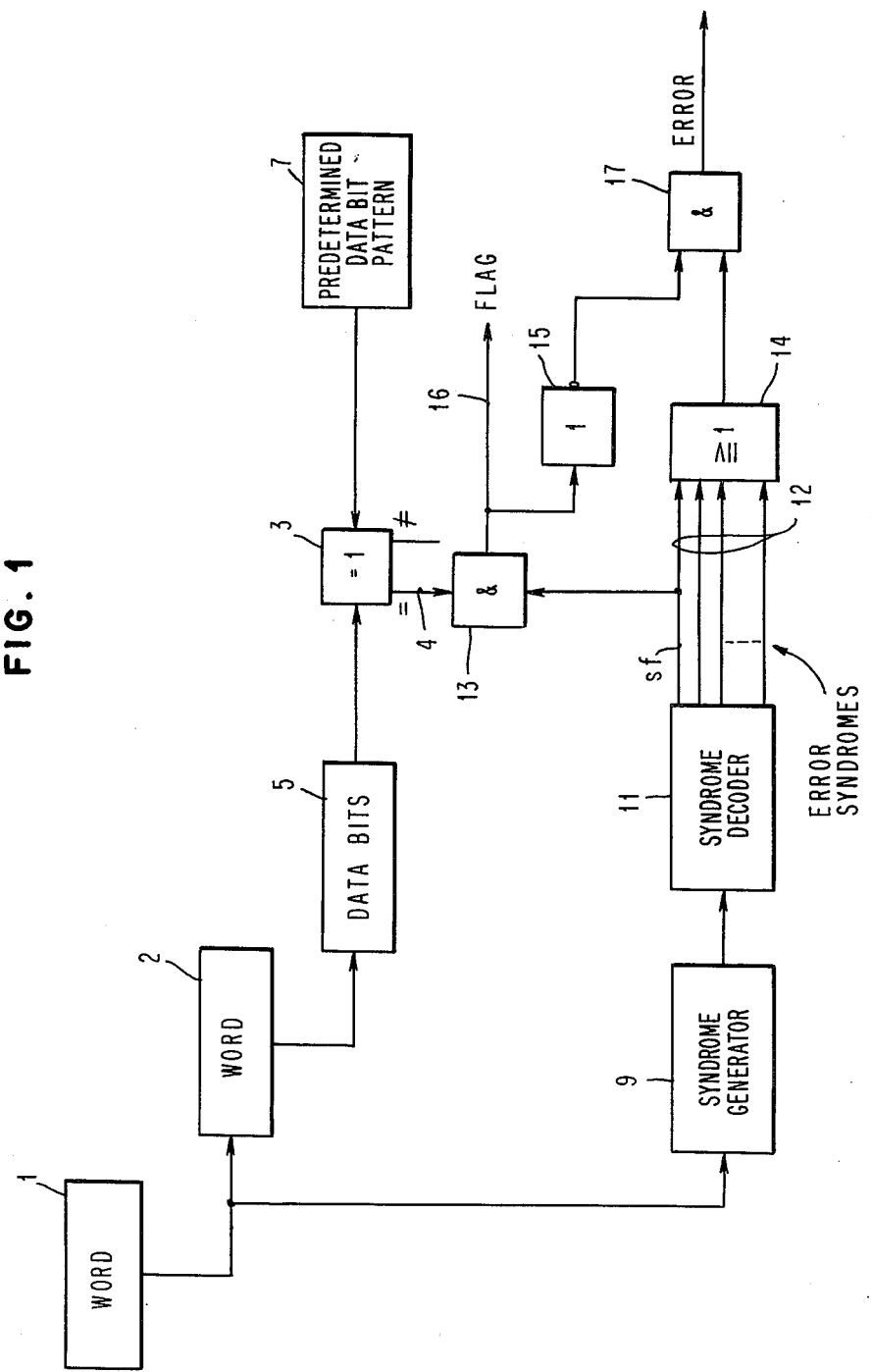
FIG. 1 is a simplified block diagram of the invention as it would be incorporated into a typical information handling system.

A simple block diagram of the invention is shown in FIG. 1. An exemplary code structure of 72 bits is assumed; 64 data bits and 8 ECC bits. Each word received from a storage medium or communication link 1 is staged in a 72-bit wide shift register 2, and concurrently applied to syndrome generating circuits 9. Each group of 64 data and 8 ECC bits gives rise to an associated group of 8 syndrome bits. Each group of syndrome bits is applied to syndrome decoding circuits 11 which activate an associated one of up to 256 (i.e. $2^8$) output lines. A subset 12 of these output lines are associated with uncorrectable error (UE) conditions and are coupled via OR circuit 14 to AND circuit 17. One particular line "sf" in this subset, which can be associated with either a flag signal combination or a true UE condition, is connected to AND circuit 13. The 64 data bits from the word in register 2 are put in register 5 which feeds one input of a comparator circuit 3 which receives its other input from a reference 7 which contains the predetermined pattern of data bits.

If the data bits in register 5 match the reference bits in register 7, comparator 3 will produce an output on line 4 which feeds one input of AND 13. The second input of AND 13 is fed by syndrome line "sf" which will be up if the predetermined syndrome was generated by syndrome generator 9 and decoded by syndrome decoder 11. The concurrence of the predetermined syndrome and the predetermined data pattern will enable AND 13 which will present, via line 16, a signal to the information processing system that the particular flag has been detected. When the flag has been detected, the enabled output of AND 13 will, by acting through inverter 15, disable AND 17, thereby preventing an error indication from being transmitted to the information processing system.

If the predetermined syndrome sf does not appear, the results of the comparison between register 5 and reference medium 7 will not affect the system. Similarly, if the contents of register 5 do not match the reference contained in medium 7, AND 13 will not be enabled and if syndrome sf (or any other error syndrome) were to appear, it would be transmitted to the information processing system through OR 14 and AND 17 to signal the occurrence of an error.

The simplicity of this invention can be appreciated by noting that most of the elements shown in FIG. 1 would already be present in a typical information processing system. In addition to modification of the source 1, the elements added by this invention would be comparator 3, data register 5 (which would already be present in some systems), reference medium 7, AND 13 and inverter 15. All of the remaining elements would typically already be present in any information processing system utilizing a single error correction double error detection code.

With appropriate selection of the data and ECC flag combination, it is possible to adapt such systems to recognize the flag combination even when it contains a single bit error. In such circumstances a data match in conjunction with a generated single error syndrome having unit code value distance from "sf" is recognized as a flag. Also, a data mismatch in conjunction with a syndrome having unit distance from "sf" would activate error correction circuits to apply a single error correction to the data, which in turn would give rise to generation of data and syndrome "sf" (i.e. the flag recognition), or to another combination representing a true UE.

This invention may also be used to embed distinguishing indications in storage areas of a data processing system without dedicating storage space exclusively for this purpose. For instance, the PL/I checkout compiler (refer to "PL/I LANGUAGE REFERENCE MANUAL" publication number GC 33-009, available through IBM sales representatives and branch offices) requires a capability of distinguishing between initialized and uninitialized storage variables. In accordance with the present invention this capability can be achieved simply by storing a special "nominally illegal" pattern of data and ECC bits to signify uninitialized status in the associated area. Upon removal from storage the data is compared to a reference pattern while the data and associated ECC bits are being monitored by the conventional error detection and correction circuitry associated with storage access. If the output data matches the reference pattern and there is detection of a particular UE syndrome the associated UE condition is masked or inhibited and a program interruption is generated. With this interruption the uninitialized condition of the just-addressed storage area can be effectively communicated to programs responsible for supervising "normal" PL/I operations.

In the above discussion, and in the discussions to follow, no detailed description is provided as to the manner in which source 1 produces the predetermined data pattern and concatenates to it appropriate ECC bits so that the predetermined syndrome will be generated when the word is received. A variety of techniques such as, for example, microinstruction sequences which are triggered by software instructions, are well known to those skilled in the art. Some techniques are suggested in the prior art discussed above. The only significant requirement is that the source 1 (which, of course, could be part of the same information processing system which is utilizing the data) be able to generate the predetermined unique combination of data bits and ECC bits. This generally will require that the source be able to at least partially disable or ignore its own error detection and correction circuitry.

Figure 2:
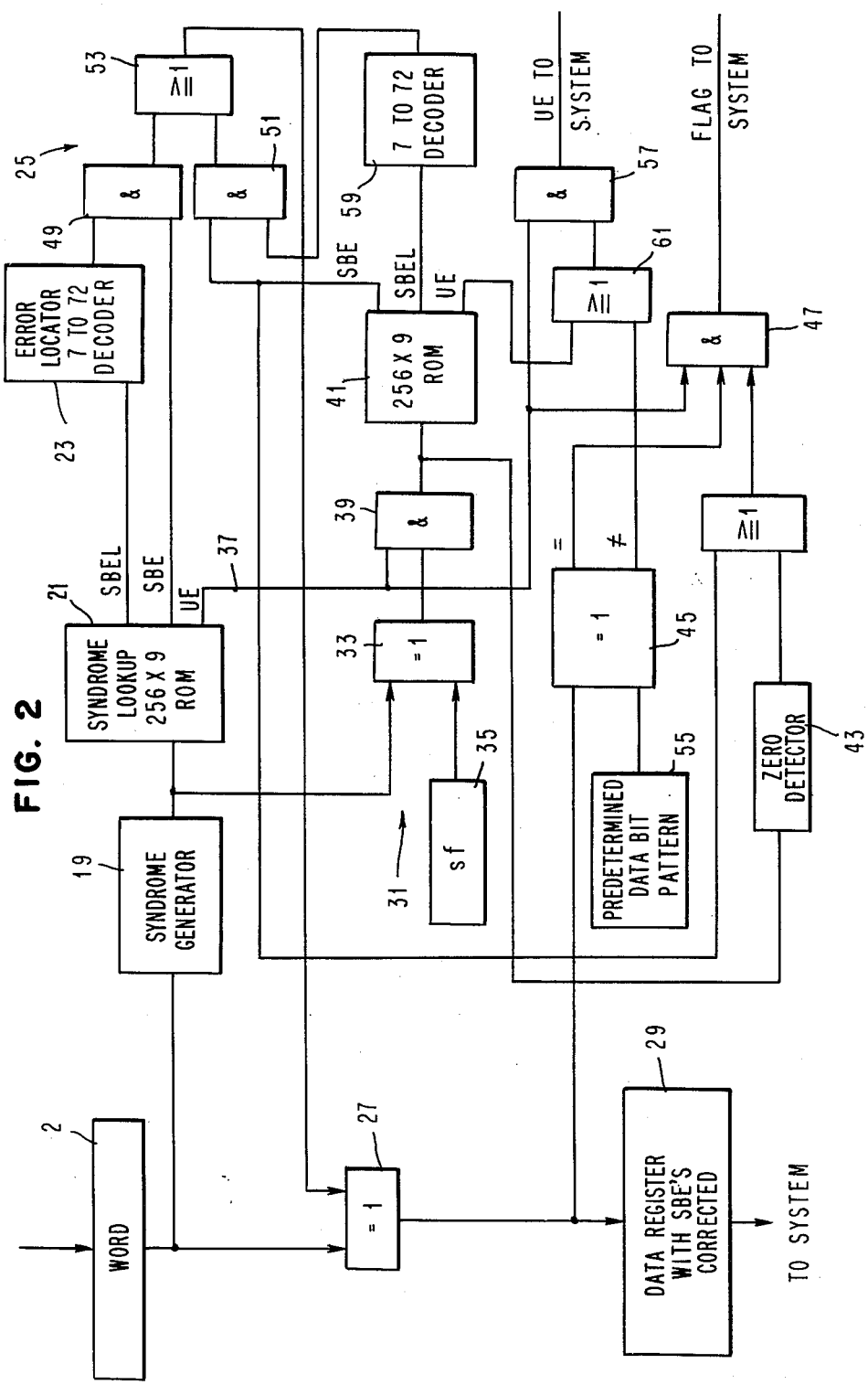
FIG. 2 provides more details of an embodiment of the invention which can be used to detect a single special character.

Referring now to FIG. 2, additional details are shown of a preferred embodiment of the invention. 72-bit word combinations of data and check bits, from a storage medium or communication link are latched (preferably in bit-parallel form) into register 2. Standard checking apparatus with correction capability (including syndrome generator 19, syndrome lookup read only memory ROM 21, error locator decoder 23, error steering gates 25 and corrector Exclusive ORs 27) corrects any single bit error present in the data and latches the corrected data into register 29. Register 29 presents the corrected data at its output to the processing system.

If the syndrome indicated by ROM 19 is one which normally represents an uncorrectable error UE (two or more bit errors in a single word), circuitry 31 for recognition of a special control flag condition is utilized. The bits of the 8-bit syndrome generated by syndrome generator 19 are fed to Exclusive ORs 33. ExclusiveORs 33 also receive a reference 8-bit syndrome stored in an appropriate medium 35. If the syndrome decoder ROM 21 detects a syndrome representative of an uncorrectable error, line 37 will enable AND 39 so the Exclusive-OR of sf with the output of syndrome generator 19 will be passed to table lookup ROM 41 for translation. In the preferred embodiment, ROM 41 is identical to ROM 21. This provides some error correction capability with respect to the special flag. Two cases can be indicated at the output of ROM 41: an uncorrectable error UE; or a single bit error SBE. When a SBE is indicated there will also be a 7-bit code SBEL uniquely defining the bit location of the single bit error.

The concurrence of a UE signal on line 37 and all zeros at the output of AND 39 (as recognized by zero detector 43) enables AND 47 to signal the occurrence of a special "no-error" condition associated with the flag syndrome sf. This indicates that a flag syndrome has been detected. In this situation, neither of ANDs 49 or 51 will have been enabled, so there will be no output from OR 53. Therefore, Exclusive-ORs 27 will pass the contents of register 2 unchanged. If the value of the data portion of the contents of register 2 equals the predetermined data bit pattern held in medium 55, the output of comparator 45 will furnish the third input necessary to enable AND 47 to indicate detection of a flag. This flag is then indicated to the using system, for example, by signalling a program interrupt to the processor using the storage device. In addition, since the comparator 45 indicates that the data bit pattern was equal to the reference pattern, AND 57 will not be enabled and no UE indication is given to the system.

If the output of AND circuits 39 indicate a nonzero syndrome, the modified syndrome is used as an address into ROM 41 to determine if the syndrome represents a single bit error. If it does, by the activation of the SBE bit output, the error locator field (SBEL) of the ROM is gated to a one-of 72 (7 bit to 72 decoder) decoder 59. The output of decoder 59 is presented to Exclusive ORs 27 via AND/OR 51, 53 to correct the single bit error. The corrected data is then presented to the comparator 45 whose output is interpreted as described above.

If the output of ROM 41 indicates that the modified syndrome still indicates a UE, the UE output of the ROM goes through OR 61 to AND 57 to indicate a UE to the system.

Because ROM 21 is identical to ROM 41, and decoder 23 is identical to decoder 59, a design could be employed which time-shares these parts to reduce cost. However, in such an embodiment, recognition of a flag would take longer than in the implementation shown.

Figure 3:
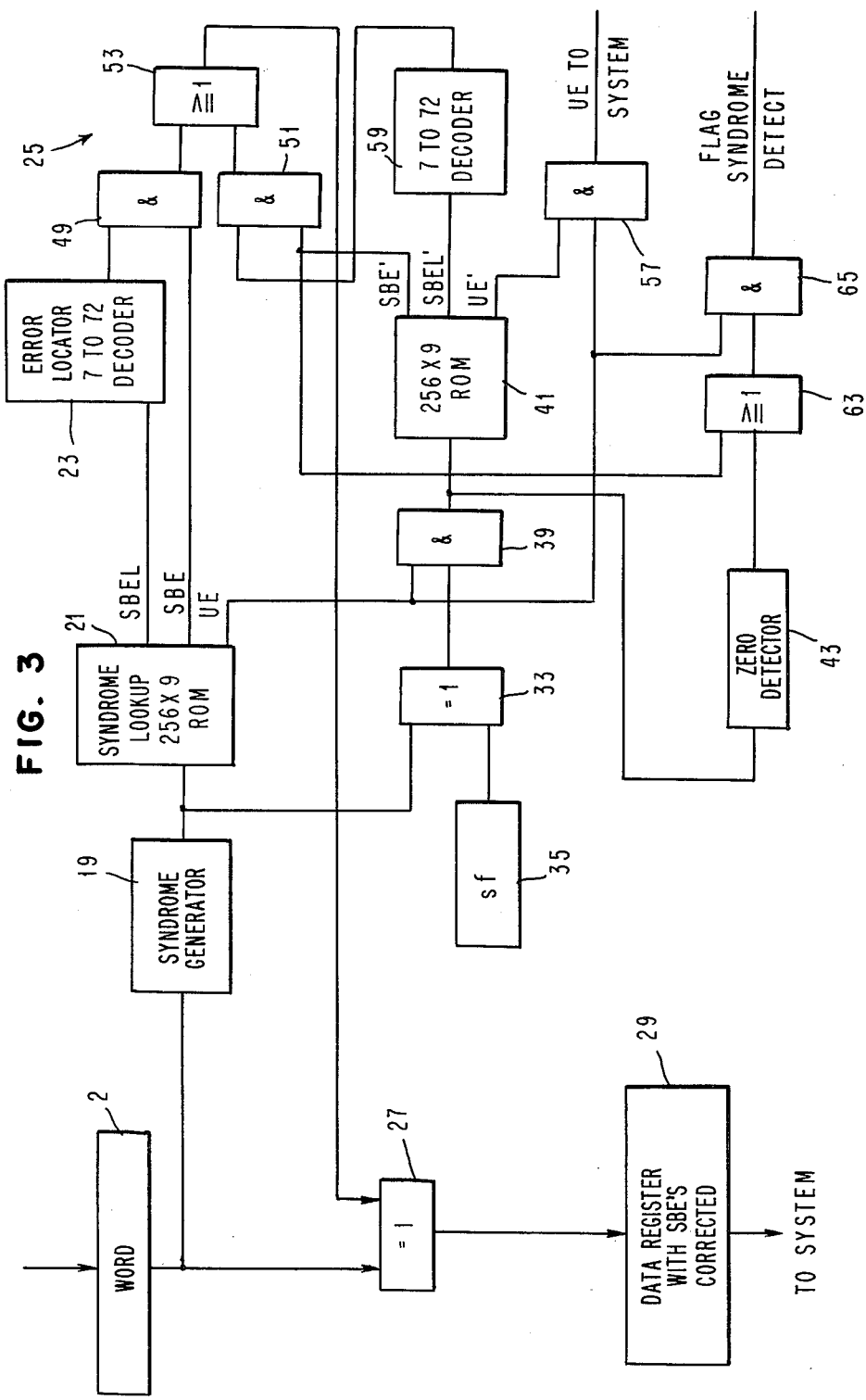
FIG. 3 is an alternative embodiment of the invention similar to the one shown in FIG. 2, but which allows the determination of a multiplicity of different special characters within the same computer system.

FIG. 3 shows an alternative embodiment which is similar to the one shown in FIG. 2, but which allows the determination of a multiplicity of different flag patterns within the same computer system. The embodiment of FIG. 3 would allow, for instance, storage of different flag data word symbols for different users, so that each user could prevent other users from having access to data deliniated by his flag symbol.

In this embodiment, as in the previous embodiment, the syndrome derived from the currently manifested word is examined for association with either good data, a single bit error or an uncorrectable error (UE). If a UE syndrome is detected by ROM 21, that syndrome is Exclusive ORed with the flag syndrome sf in Exclusive ORs 33 and then further decoded to show either a zero (indicating a flag syndrome without an error), a single bit error (SBE) or an uncorrectable error (UE) as before. An indication of no error or a single bit error (with the location of the single bit error indicated by the output of error locator 59) results in correct data going to the system processing circuits via register 29 without any flag or UE error indication. If ROM 21 indicates a UE and a flag is not detected, AND circuits 57 indicate an uncorrectable error to the using information processor. If ROM 21 indicates a UE and a flag syndrome, with or without a single bit error, is detected, OR 63 will enable AND 65 to indicate a flag symbol detection to the using processor. The associated data word will be presented to the processor in register 29.

By appropriate programming, each processor could reference a table of data patterns (for example, one pattern corresponding to each user program for which following data words are to be presented). The value manifested in register 29 could then be compared by each processor to the value in the table, for extraction of an associated flag. If no match is detected, the processor would recognize that either the data contains an uncorrectable error or it represents another user's flag. There is no way to determine which of these situations actually occurred. However, in either case the processor examining the data would be able to determine that the data has no validity for that processor.

Those skilled in the art will recognize that various changes can be made in the embodiments described above. For example, words of any desired length may be used instead of the 72 bit words discussed above. Also, any desired linear error detection code may be used. It is preferred that the code have at least single error correction capability, but this invention could be implemented in a system having single error detection without error correction. However, this is not preferred because such an implementation would tend to be a little less reliable than an implementation with error correction capability. Of course, the invention is quite suitable to use in systems with higher error correction capabilities.

While the invention has been described with reference to preferred embodiments thereof, it will be understood that the above and other changes may be made without departing from the spirit and scope of the invention.

Having thus described my invention, what I claim as new, and desire to secure by Letters Patent is:

1. In a system for processing information manifested as combinations of data bits and error correcting code (ECC) check bits, said system including checking apparatus for detecting combinations of said data and ECC bits indicative of an error in the combination, said checking apparatus including means for signalling said system when an error is detected in a combination; apparatus for conditioning said system to perform special control functions comprising:

means for detecting a predetermined unique combination of data and ECC bits, said combination being one which is recognized by said checking apparatus as being indicative of an error in the combinations;

means responsive to detection of said predetermined combination for applying a special control indication to said processing apparatus, effectively distinguishing said predetermined combination as having special control significance; and means responsive to said special control indication for effectively superseding any error indication produced by said checking apparatus in respect to said combination.

2. Control apparatus in accordance with claim 1 wherein said checking means includes means for distinguishing a plurality of syndromes, each associated with a different group of bit combinations containing an uncorrectable error, and means responsive to detection of any one of said plurality of syndromes for presenting an indication of uncorrectable error to said system, and wherein said means for detecting further comprises:

means associated with said checking apparatus for detecting a predetermined one of said plurality of syndromes;

data bit comparing means for comparing the data bit portion of each combination of data and ECC bits with a reference pattern of bits corresponding to the data bit portion of said predetermined combination;

means responsive to the detection of said predetermined one of said plurality of syndromes in conjunction with detection of a match by said data bit comparing means for producing an indication representing detection of said predetermined combination; and means coupling said indication representing detection of said predetermined combination to said means for applying said special control indication, for application to said system.

3. Control apparatus in accordance with claim 2 further including:
means responsive to said detection of said predetermined combination, for suppressing the indication of uncorrectable error to said system.

4. Control apparatus in accordance with claim 1 wherein said predetermined combination represents a boudary delimiting flag in relation to subsequently manifested combinations of data bits, and wherein said special control indication presented to said processing apparatus represents a current manifestation of said flag.

5. In a system for processing information manifested as combinations of data bits and error correcting code (ECC) check bits, which system includes checking apparatus for producing indications of valid and invalid bit combinations in response to manifestations of different combinations of said bits; a method of controlling said system comprising:
using at least one uncorrectable error combination of data and check bits as a predetermined indication to said system to perform a control function;
detecting said predetermined indication as an invalid bit combination;
applying a predetermined control stimulus to said system in response to detection of said predetermined indication; and
suppressing any indication of invalidity by said checking apparatus in response to said at least one uncorrectable error.

6. The method of claim 5 wherein said checking apparatus includes means for distinguishing a plurality of syndromes, each associated with a different group of bit combinations containing an uncorrectable error, and means responsive to detection of any one of said plurality of syndromes for presenting an indication of uncorrectable error to said system, and wherein said detecting step comprises:
detecting a predetermined one of said plurality of syndromes;
comparing the data bit portion of each combination of data and ECC bits with a predetermined reference pattern of bits; and
responding to the detection of said predetermined one of said plurality of syndromes in conjunction with detection of a match by said comparison step, by producing said predetermined control stimulus.

7. In a system for processing information manifested as combinations of data bits and error correcting code (ECC) check bits, said system including checking apparatus for detecting combinations of said data and ECC bits indicative of an error in the combination, said checking apparatus including means for signalling said system when an error is detected in the combination; apparatus for conditioning said system to perform special control functions comprising:
means for detecting any of a group of predetermined unique combinations of data and ECC bits, said combinations being among those which are recognized by said checking apparatus as being indicative of an error in the combinations;
means responsive to detection of any of said predetermined combinations for applying a special control indication to said processing apparatus, effectively distinguishing said detected combination as having special control significance; and
means responsive to the special control indication effectively superseding any error indication produced by said checking apparatus in respect to said combinations.

8. Control apparatus in accordance with claim 7 wherein said checking means includes means for distinguishing a plurality of syndromes, each associated with a different group of bit combinations containing an uncorrectable error, and means responsive to detection of any one of said plurality of syndromes for presenting an indication of uncorrectable error to said system, and wherein said means for detecting further comprises:
means associated with said checking apparatus for detecting predetermined ones of said plurality of syndromes;
data bit comparing means for comparing the data bit portion of each combination of data and ECC bits with reference patterns of bits corresponding to the data bit portions of said predetermined combinations;
means responsive to the detection of said predetermined ones of said plurality of syndromes in conjunction with detection of a match by said data bit comparing means for producing an indication representing detection of said predetermined combination;
means responsive to said indication representing detection of one of said predetermined combinations for suppressing the indication of uncorrectable error to said system; and
means coupling said indication representing detection of one of said predetermined combinations to said means for applying said special control indication, for application to said system.

9. In a system for processing information manifested as combinations of data bits and error correcting code (ECC) check bits, which system includes checking apparatus for producing indications of valid and invalid bit combinations in response to manifestations of different combinations of said bits; and method of controlling said system comprising:
using each of a plurality of uncorrectable error combinations of data and check bits as a predetermined indication to said system to perform control functions;
detecting one of said predetermined plurality of indications as an invalid bit combination;
applying a control stimulus to said system in response to detection of one of said plurality of predetermined indications; and
suppressing any indication of invalidity by said checking apparatus in response to said plurality of error combinations.

10. The method of claim 9 wherein said checking apparatus includes means for distinguishing a plurality of syndromes, each associated with a different group of bit combinations containing an uncorrectable error, and means responsive to detection of any one of said plurality of syndromes for presenting an indication of uncorrectable error to said system, and wherein said detecting step comprises:
detecting predetermined ones of said plurality of syndromes;
comparing the data bit portion of each combination of data and ECC bits with predetermined reference patterns of bits; and
responding to the detection of one of said predetermined ones of said plurality of syndromes in conjunction with detection of a match by said comparison step, by producing said predetermined control stimulus.

* * * * *